US009728112B2

United States Patent
Chen et al.

(10) Patent No.: US 9,728,112 B2
(45) Date of Patent: Aug. 8, 2017

(54) ARRAY SUBSTRATE, LIQUID CRYSTAL DISPLAY PANEL, AND DETECTING METHOD OF LIQUID CRYSTAL DISPLAY PANEL

(71) Applicant: SHENZHEN CHINA STAR OPTOELECTRONICS TECHNOLOGY CO., LTD., Guangdong (CN)

(72) Inventors: Cheng-Hung Chen, Guangdong (CN); Zui Wang, Guangdong (CN)

(73) Assignee: SHENZHEN CHINA STAR OPTOELECTRONICS TECHNOLOGY CO., Guangdong (CN)

( * ) Notice: Subject to any disclaimer, the term of this patent is extended or adjusted under 35 U.S.C. 154(b) by 165 days.

(21) Appl. No.: 14/417,525

(22) PCT Filed: Dec. 23, 2014

(86) PCT No.: PCT/CN2014/094579
§ 371 (c)(1),
(2) Date: Jan. 26, 2015

(87) PCT Pub. No.: WO2016/095242
PCT Pub. Date: Jun. 23, 2016

(65) Prior Publication Data
US 2016/0180754 A1    Jun. 23, 2016

(30) Foreign Application Priority Data

Dec. 17, 2014   (CN) .......................... 2014 1 0785475

(51) Int. Cl.
*G01R 31/26* (2014.01)
*G09G 3/00* (2006.01)
*G02F 1/1333* (2006.01)
*G02F 1/1343* (2006.01)
*G02F 1/1362* (2006.01)
(Continued)

(52) U.S. Cl.
CPC ........... *G09G 3/006* (2013.01); *G02F 1/1309* (2013.01); *G02F 1/13439* (2013.01); *G02F 1/133345* (2013.01); *G02F 1/136213* (2013.01); *G02F 1/136286* (2013.01); *H01L 27/124* (2013.01); *H01L 27/1255* (2013.01)

(58) Field of Classification Search
USPC ....................................... 324/760.01–760.02
See application file for complete search history.

(56) References Cited

U.S. PATENT DOCUMENTS

2013/0146876 A1*   6/2013   Qin ..................... H01L 27/1255
257/59

* cited by examiner

*Primary Examiner* — Minh Phan
(74) *Attorney, Agent, or Firm* — WPAT, P.C., Intellectual Property Attorneys; Anthony King

(57) ABSTRACT

An array substrate is provided. The array substrate comprises a substrate, a common electrode, an insulating layer, a pixel transparent electrode, and a sharing capacitor transparent electrode, wherein a separating area is disposed between the pixel transparent electrode and the sharing capacitor transparent electrode; the common electrode extends to the separating area, and is exposed on the surface of the separating area by at least one groove which is on the insulating layer. Thereby a defectiveness of a product due to an ITO (indium tin oxide) remaining on the surface of the array substrate can easily detected.

10 Claims, 6 Drawing Sheets

(51) Int. Cl.
*H01L 27/12* (2006.01)
*G02F 1/13* (2006.01)

ARRAY SUBSTRATE, LIQUID CRYSTAL DISPLAY PANEL, AND DETECTING METHOD OF LIQUID CRYSTAL DISPLAY PANEL

FIELD OF THE INVENTION

The present invention relates to a technological field of liquid crystal displays, and more particularly to an array substrate, a liquid crystal display panel, and a detecting method of the liquid crystal display panel.

BACKGROUND OF THE INVENTION

With the technological development of the society, liquid crystal display devices are becoming increasingly important main stream display devices. For improving a chromatic aberration phenomenon when a liquid crystal display device of a vertically aligned mode is seen from a large viewing angle, electric charge share is adopted in the design of the pixels, namely a pixel is divided into two areas, which are a main pixel area and a sub pixel area.

Refer to FIG. 1, which is a schematic view of a circuit of a conventional liquid crystal display panel. The liquid crystal display panel 10 comprises a data line 11, a main scan line 12, a sub scan line 13, a common line 16, a main pixel area 14, and a sub pixel area 15, wherein the main pixel area 14 is provided with a main liquid crystal capacitor 141, a main storage capacitor 142, and a first transistor 143; and the sub pixel area 15 is provided with a sub liquid crystal capacitor 151, a sub storage capacitor 152, an electric charge sharing capacitor 153, a second transistor 154, and a third transistor 155.

The following is a normal displaying condition of the liquid crystal display panel 10. A high level is inputted into the main scan line 12, and the first transistor 143 and the second transistor 154 are switched on; a low level is inputted into the sub scan line 13, and the third transistor 155 is switched off; and thereby the main liquid crystal capacitor 141, the main storage capacitor 142, the sub liquid crystal capacitor 151, and the sub storage capacitor 152 are charged to the same electric potential. Next, a low level is inputted into the main scan line 12, the first transistor 143 and the second transistor 154 are switched off; a high level is inputted into the sub scan line 13, and the third transistor 155 is switched on; and thereby the electric potential of the sub storage capacitor 152 and the sub liquid crystal capacitor 151 is lowered by the electric charge sharing capacitor 153, so that the electric potential of the sub liquid crystal capacitor 151 and the sub storage capacitor 152 is lower than the electric potential of the main liquid crystal capacitor 141 and the main storage capacitor 142. Therefore, the twisting distribution of the liquid crystal molecules is different in the main pixel area 14 and the sub pixel area 15, so that the main pixel area 14 and the sub pixel area 15 have different displaying brightness under the same signal, and thereby a large viewing angle of the liquid crystal display panel 10 is accomplished.

Refer to FIGS. 2A and 2B, wherein FIG. 2A is a structural schematic view of an array substrate of the conventional liquid crystal display panel, and FIG. 2B is a cross section view of a cross section line A-A' of FIG. 2A. The electric charge sharing capacitor 153 is constructed by a sharing capacitor transparent electrode 21, an insulating layer 22, and a common electrode 23. The liquid crystal capacitors (the main liquid crystal capacitor 141 and the sub liquid crystal capacitor 151) are constructed by a pixel transparent electrode 24 and another transparent electrode of a cell assembling substrate. When manufacturing the array substrate, it is possible that a material of the transparent electrode (for example, ITO, indium tin oxide) may remain on the surface. If the remaining ITO is between the sharing capacitor transparent electrode 21 and the pixel transparent electrode 24, it is possible that when charging the liquid crystal capacitors, the electric charge sharing capacitor 153 is also charged, so that the pixel structure with an electric charge distribution fails.

When using a conventional technology, there is no way to detect the above-mentioned defectiveness in a liquid crystal display panel.

Hence, it is necessary to provide an array substrate, a liquid crystal display panel, and a detecting method of the liquid crystal display panel which solves the problem existing in the conventional technology.

SUMMARY OF THE INVENTION

The object of the present invention is to provide a detecting method which can solve the technical problem that the ITO remaining on the surface of the array substrate cannot be detected in the conventional array substrate, liquid crystal display panel, and detecting method of the liquid crystal display panel.

For solving the above-mentioned technical problems, the present invention provides an array substrate, which comprises:

a substrate;

at least one common electrode disposed on the substrate, which is used to provide a common signal;

an insulating layer disposed on the common electrode, which is used to separate the common electrode from at least one sharing capacitor transparent electrode;

at least one pixel transparent electrode disposed on the insulating layer, which is used to form a liquid crystal capacitor; and the sharing capacitor transparent electrode disposed on the insulating layer, which is used to form an electric charge sharing capacitor with the common electrode;

wherein a separating area is disposed between the pixel transparent electrode and the sharing capacitor transparent electrode; the common electrode extends to the separating area, and is exposed on the surface of the separating area by at least one groove which is on the insulating layer.

In the array substrate of the present invention, a length of the at least one groove is approximately equal to the length of the separating area.

In the array substrate of the present invention, the insulating layer is provided with a plurality of grooves which are used to expose the common electrode.

In the array substrate of the present invention, the array substrate further comprises a data line, a main scan line, a sub scan line, a first transistor, a second transistor, and a third transistor; the pixel transparent electrode comprises a main pixel transparent electrode and a sub pixel transparent electrode.

In the array substrate of the present invention, the data line is respectively connected with a source electrode of the first transistor and a source electrode of the second transistor; the main pixel transparent electrode is respectively connected with a drain electrode of the first transistor and a drain electrode of the second transistor; the sub pixel transparent electrode is respectively connected with the drain electrode of the first transistor and the drain electrode of the second transistor; the main scan line is respectively connected with a gate electrode of the first transistor and a gate electrode of the second transistor; the sub scan line is connected with a gate electrode of the third transistor; the source of the third transistor is connected with the sub pixel transparent electrode; and the drain of the third transistor is connected with the sharing capacitor transparent electrode.

In the array substrate of the present invention, if a pixel corresponding to the pixel transparent electrode is a dark spot, the sharing capacitor transparent electrode is connected with the common electrode in the separating area, and/or the pixel transparent electrode is connected with the common electrode in the separating area.

The present invention further provides a liquid crystal display panel, which comprises an array substrate, a cell assembling substrate, and a liquid crystal layer disposed between the array substrate and the cell assembling substrate, wherein the array substrate comprises:
  a substrate;
  at least one common electrode disposed on the substrate, which is used to provide a common signal;
  an insulating layer disposed on the common electrode, which is used to separate the common electrode from at least one sharing capacitor transparent electrode;
  at least one pixel transparent electrode disposed on the insulating layer, which is used to form a liquid crystal capacitor; and
  the sharing capacitor transparent electrode disposed on the insulating layer, which is used to form an electric charge sharing capacitor with the common electrode;
  wherein a separating area is disposed between the pixel transparent electrode and the sharing capacitor transparent electrode; the common electrode extends to the separating area, and is exposed on the surface of the separating area by at least one groove which is on the insulating layer.

In the liquid crystal display panel of the present invention, a length of the at least one groove is approximately equal to the length of the separating area.

In the liquid crystal display panel of the present invention, the insulating layer is provided with a plurality of grooves which are used to expose the common electrode.

In the liquid crystal display panel of the present invention, the array substrate further comprises a data line, a main scan line, a sub scan line, a first transistor, a second transistor, and a third transistor; the pixel transparent electrode comprises a main pixel transparent electrode and a sub pixel transparent electrode.

In the liquid crystal display panel of the present invention, the data line is respectively connected with a source electrode of the first transistor and a source electrode of the second transistor; the main pixel transparent electrode is respectively connected with a drain electrode of the first transistor and a drain electrode of the second transistor; the sub pixel transparent electrode is respectively connected with the drain electrode of the first transistor and the drain electrode of the second transistor; the main scan line is respectively connected with a gate electrode of the first transistor and a gate electrode of the second transistor; the sub scan line is connected with a gate electrode of the third transistor; the source of the third transistor is connected with the sub pixel transparent electrode; and the drain of the third transistor is connected with the sharing capacitor transparent electrode.

In the liquid crystal display panel of the present invention, if a pixel corresponding to the pixel transparent electrode is a dark spot, the sharing capacitor transparent electrode is connected with the common electrode in the separating area, and/or the pixel transparent electrode is connected with the common electrode in the separating area.

The present invention further provides a detecting method of a liquid crystal display panel, wherein the liquid crystal display panel comprises an array substrate, a cell assembling substrate, and a liquid crystal layer disposed between the array substrate and the cell assembling substrate, wherein the array substrate comprises:
  a substrate;
  at least one common electrode disposed on the substrate, which is used to provide a common signal;
  an insulating layer disposed on the common electrode, which is used to separate the common electrode from at least one sharing capacitor transparent electrode;
  at least one pixel transparent electrode disposed on the insulating layer, which is used to form a liquid crystal capacitor; and
  the sharing capacitor transparent electrode disposed on the insulating layer, which is used to form an electric charge sharing capacitor with the common electrode;
  wherein a separating area is disposed between the pixel transparent electrode and the sharing capacitor transparent electrode; the common electrode extends to the separating area, and is exposed on the surface of the separating area by at least one groove which is on the insulating layer;
  wherein the detecting method of the liquid crystal display panel comprises;
  according to a scanning signal on the main scan line, inputting a detecting signal into the main pixel transparent electrode through the data line and the first transistor, and inputting a detecting signal into the sub pixel transparent electrode through the data line and the second transistor;
  according to a scanning signal on the sub scan line, inputting a detecting signal into the sharing capacitor transparent electrode through the sub pixel transparent electrode;
  inputting a common signal into the common electrode through the common line; and
  when a pixel corresponding to the pixel transparent electrode is shown as a dark spot, determining the pixel transparent electrode to be abnormal; if the pixel corresponding to the pixel transparent electrode is shown as a bright spot, determining the pixel transparent electrode to be normal.

In the detecting method of the liquid crystal display panel of the present invention, if a pixel corresponding to the pixel transparent electrode is a dark spot, the sharing capacitor transparent electrode is connected with the common electrode in the separating area, and/or the pixel transparent electrode is connected with the common electrode in the separating area.

In the detecting method of the liquid crystal display panel of the present invention, a length of the at least one groove is approximately equal to the length of the separating area.

In the detecting method of the liquid crystal display panel of the present invention, the insulating layer is provided with a plurality of grooves which are used to expose the common electrode.

In the detecting method of the liquid crystal display panel of the present invention, the array substrate further comprises a data line, a main scan line, a sub scan line, a first transistor, a second transistor, and a third transistor; the pixel transparent electrode comprises a main pixel transparent electrode and a sub pixel transparent electrode.

In the detecting method of the liquid crystal display panel of the present invention, the data line is respectively connected with a source electrode of the first transistor and a source electrode of the second transistor; the main pixel transparent electrode is respectively connected with a drain electrode of the first transistor and a drain electrode of the second transistor; the sub pixel transparent electrode is respectively connected with the drain electrode of the first transistor and the drain electrode of the second transistor; the main scan line is respectively connected with a gate electrode of the first transistor and a gate electrode of the second transistor; the sub scan line is connected with a gate electrode of the third transistor; the source of the third transistor is connected with the sub pixel transparent electrode; and the drain of the third transistor is connected with the sharing capacitor transparent electrode.

Compared with a conventional array substrate, liquid crystal display panel, and detecting method of a liquid crystal display panel, in the array substrate, the liquid crystal display panel, and the detecting method of the liquid crystal display panel according to the present invention, by being providing with a common electrode which is exposed in the separating area, the defectiveness of the products due to the ITO remaining on the surface of the array substrate can be easily detected. This solves a technical problem that the ITO remaining on the surface of the array substrate cannot be detected in the conventional array substrate, liquid crystal display panel, and detecting method of the liquid crystal display panel.

The above-mention contents of the present invention can be best understood by referring to the following detailed description of the preferred embodiments and the accompanying drawings.

DETAILED DESCRIPTION OF THE PREFERRED EMBODIMENTS

Figure 1:
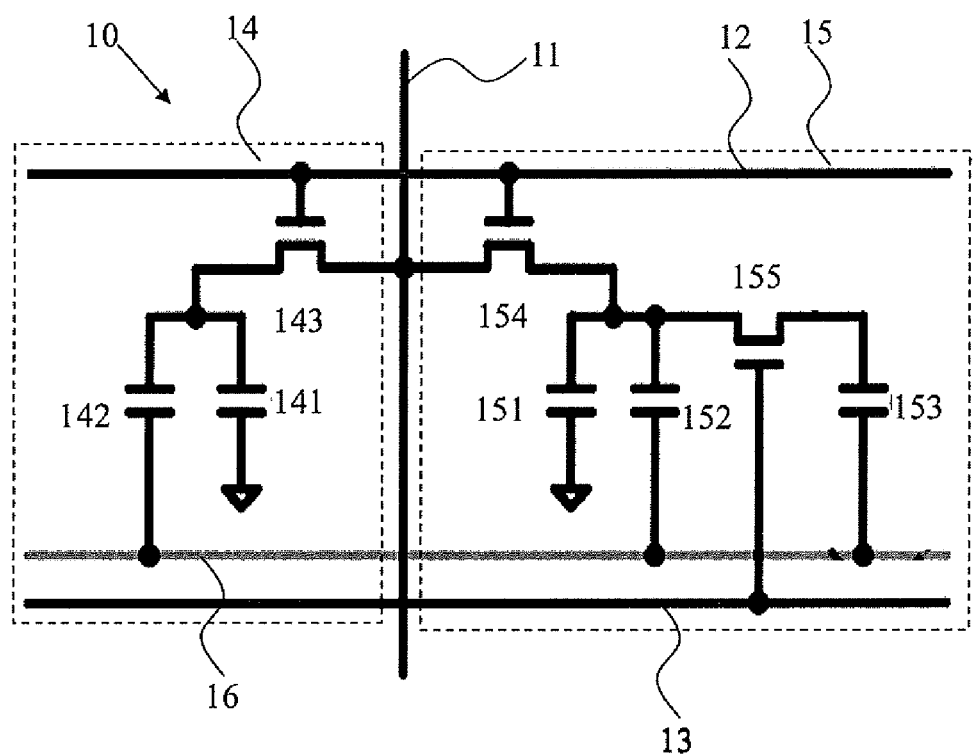
FIG. 1 is a schematic view of a circuit of a conventional liquid crystal display panel.
Figure 2A:
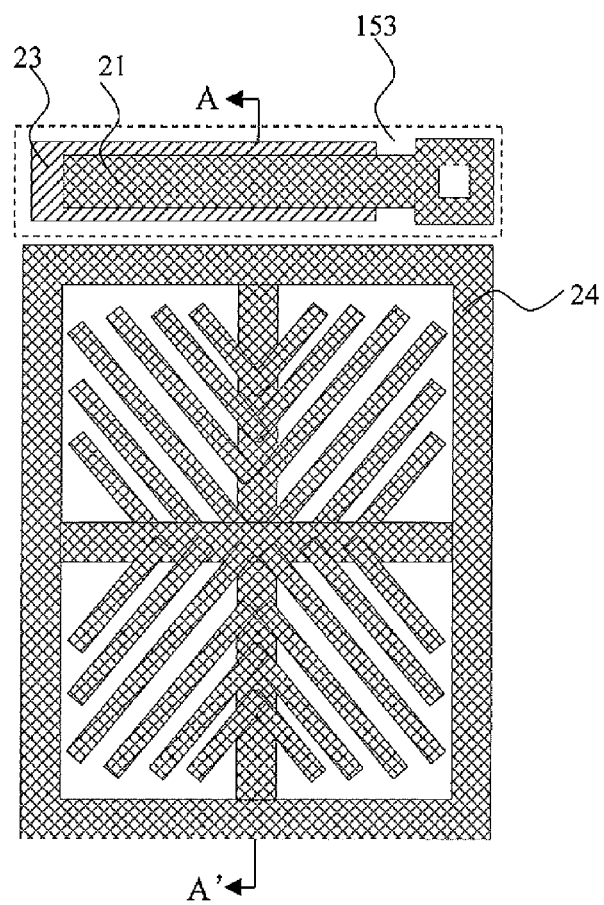
FIG. 2A is a structural schematic view of an array substrate of the conventional liquid crystal display panel.
Figure 2B:
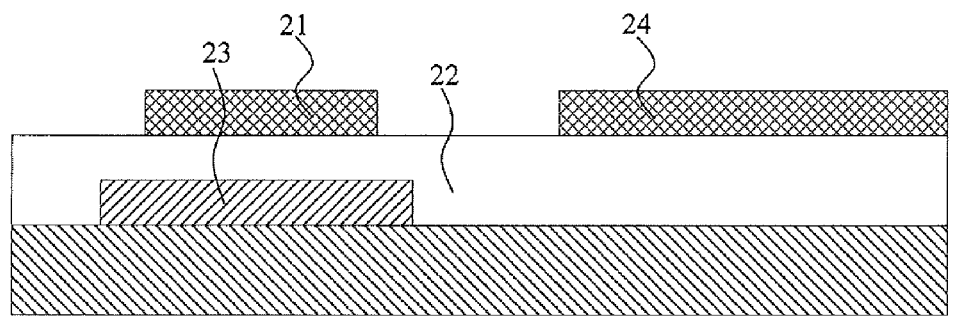
FIG. 2B is a cross section view of a cross section line A-A' of FIG. 2A.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inner, outer, side, etc., are only directions with reference to the accompanying drawings, so that the used directional terms are used to describe and understand the present invention, but the present invention is not limited thereto. In the drawings, units with similar structures use the same numerals.

Figure 3A:
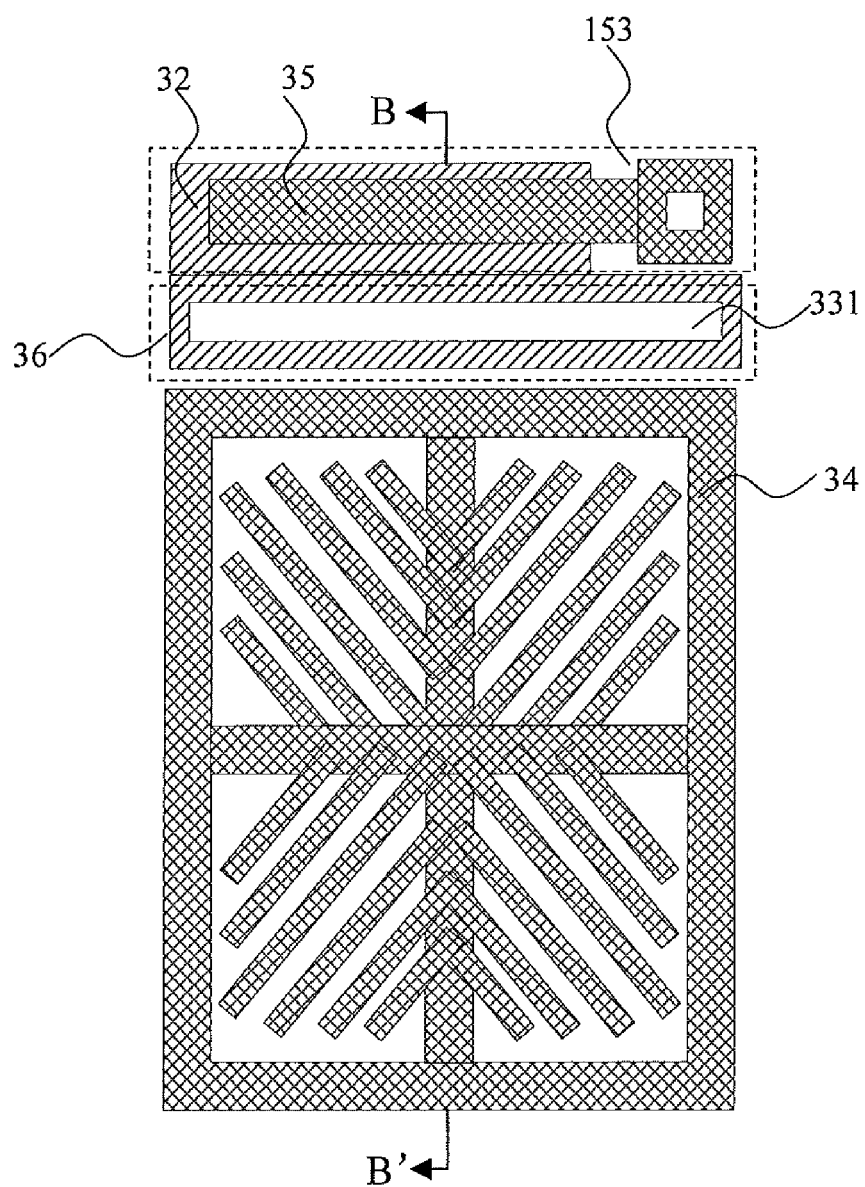
FIG. 3A is a structural schematic view of an array substrate of a liquid crystal display panel according to a first preferred embodiment of the present invention.
Figure 3B:
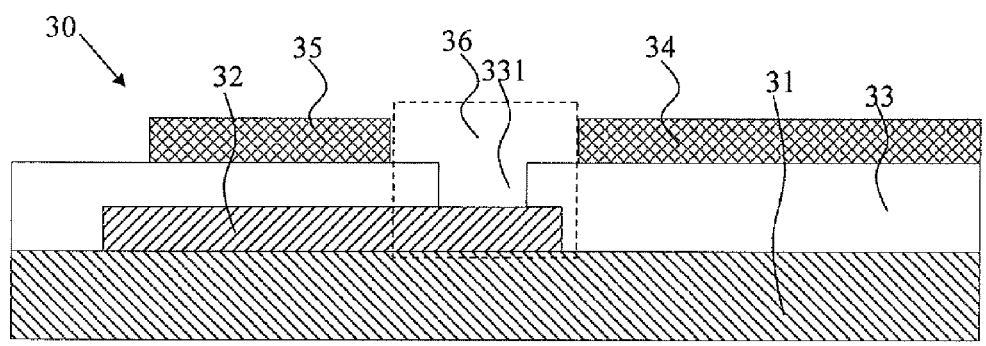
FIG. 3B is a cross section view of a cross section line B-B' of FIG. 3A.

Refer to FIGS. 3A and 3B, wherein FIG. 3A is a structural schematic view of an array substrate of a liquid crystal display panel according to a first preferred embodiment of the present invention; and FIG. 3B is a cross section view of a cross section line B-B' of FIG. 3A. The liquid crystal display panel according to the preferred embodiment of the present invention comprises an array substrate 30, a cell assembling substrate (not shown), and a liquid crystal layer disposed between the array substrate 30 and the cell assembling substrate (not shown). The array substrate 30 comprises a substrate 31, a common electrode 32, an insulating layer 33, a pixel transparent electrode 34, and a sharing capacitor transparent electrode 35. The common electrode 32 is disposed on the substrate 31, which is used to provide a common signal; the insulating layer 33 is disposed on the common electrode 32, which is used to separate the common electrode 32 from the sharing capacitor transparent electrode 35; the pixel transparent electrode 34 is disposed on the insulating layer 33, which is used to form a liquid crystal capacitor with another transparent electrode of the cell assembling substrate; and the sharing capacitor transparent electrode 35 is disposed on the insulating layer 33, which is used to form an electric charge sharing capacitor with the common electrode 32. In the preferred embodiment, the pixel transparent electrode 34 comprises a main pixel transparent electrode and a sub pixel transparent electrode.

In the preferred embodiment, there is a separating area 36 disposed between the pixel transparent electrode and the sharing capacitor transparent electrode, and the common electrode 32 extends to the separating area 36. Furthermore, the common electrode 32 is exposed on the surface of the separating area 36 by a groove 331 which is on the insulating layer 33. The length of the groove 331 is approximately equal to the length of the separating area 36.

The circuit structure of the liquid crystal display panel according to the preferred embodiment is the same as the circuit structure of the conventional technology, as shown in FIG. 1. The array substrate of the liquid crystal display panel according to the preferred embodiment further comprises a data line 11, a main scan line 12, a sub scan line 13, a first transistor 143, a second transistor 154, and a third transistor 155. The pixel transparent electrode 34 comprises a main pixel transparent electrode (on the main pixel capacitor 141) and a sub pixel transparent electrode (on the sub pixel capacitor 151). The data line 11 is respectively connected with a source electrode of the first transistor 143 and a source electrode of the second transistor 154. The main pixel transparent electrode is respectively connected with a drain electrode of the first transistor 143 and a drain electrode of the second transistor 154. The sub pixel transparent electrode is respectively connected with the drain electrode of the first transistor 143 and the drain electrode of the second transistor 154. The main scan line 12 is respectively connected with a gate electrode of the first transistor 143 and a gate electrode of the second transistor 154. The sub scan line 13 is connected with a gate electrode of the third transistor 155. The source of the third transistor 155 is connected with the sub pixel transparent electrode. The drain of the third transistor 155 is connected with the sharing capacitor transparent electrode 35 (on the electric charge sharing capacitor 153). For example, the sharing capacitor transparent electrode 35 is connected with the drain of the third transistor 155 by a through hole disposed on the insulating layer 33.

When the array substrate 30 of the liquid crystal display panel according to the preferred embodiment is detected, the main scan line 12 conducts the first transistor 143 and the second transistor 154, and the sub scan line 13 conducts the third transistor 155. Thus, a detecting signal on the data line 11 is inputted into the main pixel transparent electrode through the first transistor 143, and inputted into the sub pixel transparent electrode through the second transistor 154; a detecting signal on the sub pixel transparent electrode is inputted into the sharing capacitor transparent electrode 35 through the third transistor 155. Therefore, it can be determined whether the main pixel and the sub pixel can be worked normally according to the displaying condition of the main pixel and the sub pixel.

Figure 4:
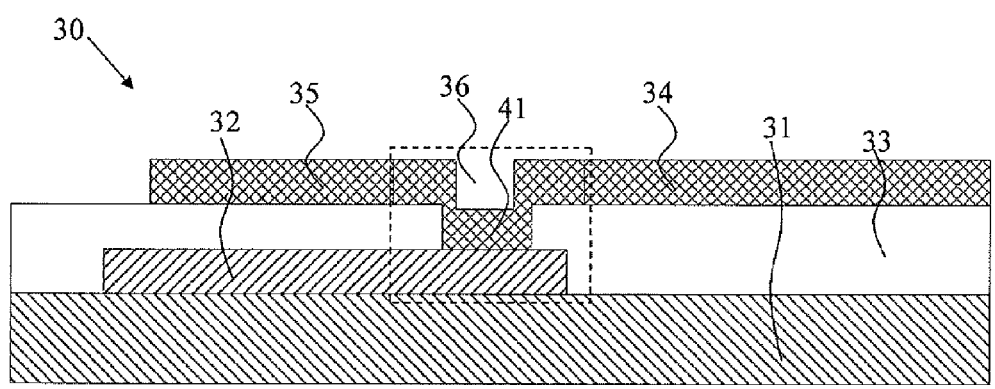
FIG. 4 is a structural schematic view of the array substrate of the liquid crystal display panel according to the present invention when in a defective condition.

Next, a common signal is inputted into the common electrode 32 through the common line 16. If the surface of the array substrate 30 has any remaining ITO (indium tin oxide) which can conduct the sharing capacitor transparent electrode 35 and the pixel transparent electrode 34 (such as the sub pixel transparent electrode), the ITO is certainly disposed on the common electrode 32 in the separating area 36, as shown in FIG. 4. FIG. 4 is a structural schematic view of the array substrate of the liquid crystal display panel according to the first preferred embodiment of the present invention when in a defective condition. That is, FIG. 4 is the structural schematic view which shows that an ITO is remaining and causes a defective condition based on FIG. 3. Therefore, the common electrode 32 will lower the electric potential of the pixel transparent electrode 34 through the remaining ITO 41, so that the displaying condition of the pixel corresponding to the pixel transparent electrode 34 is shown as a dark spot.

If the surface of the array substrate 30 has no remaining ITO, the pixel transparent electrode 34 obtains a corresponding signal, so that the displaying condition of the pixel corresponding to the pixel transparent electrode 34 is shown as a bright spot. Therefore, according to the displaying condition of the pixel being a dark spot or a bright spot, it can be determined whether the surface of the array substrate has any ITO remaining causing a defect.

In the preferred embodiment, all of the failed pixels can be detected by the dark spot of the pixel. Therefore, in the preferred embodiment, by being providing with a common electrode which is exposed in the separating area, defective products due to the ITO remaining on the surface of the array substrate can easily detected.

Figure 5A:
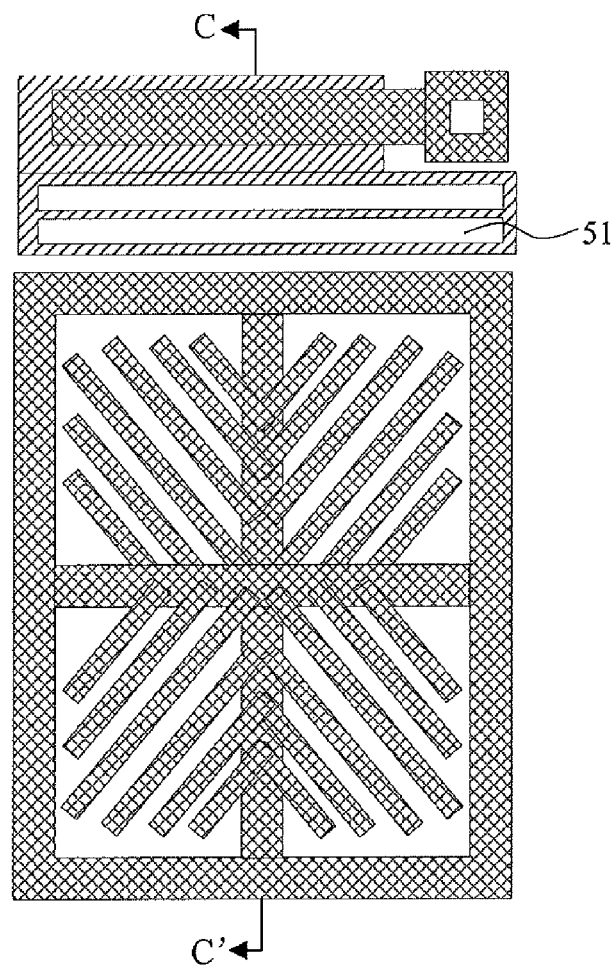
FIG. 5A is a structural schematic view of an array substrate of a liquid crystal display panel according to a second preferred embodiment of the present invention.
Figure 5B:
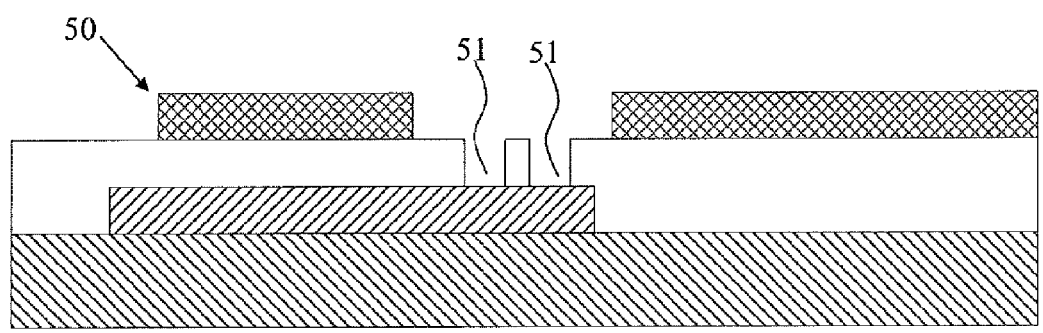
FIG. 5B is a cross section view of a cross section line C-C' of FIG. 5A.

Refer to FIGS. 5A and 5B, wherein FIG. 5A is a structural schematic view of an array substrate of a liquid crystal display panel according to a second preferred embodiment of the present invention; and FIG. 5B is a cross section view of a cross section line C-C' of FIG. 5A. Based on the first preferred embodiment, an array substrate 50 of a liquid crystal display panel according to the preferred embodiment is provided with a plurality of grooves 51 which are disposed on the insulating layer and used to expose the common electrode. By disposing the grooves 51, a defectiveness due to the ITO remaining on the surface of the array substrate 50 can easily detected. Even if the remaining ITO does not conduct the sharing capacitor transparent electrode and the pixel transparent electrode, it is possible to detect the remaining ITO, so as to prevent the liquid crystal display panel from conducting the sharing capacitor transparent electrode and the pixel transparent electrode when it is in operation.

Therefore, the liquid crystal display panel according to the preferred embodiment is provided with a plurality of grooves to improve the reliability of the liquid crystal display panel.

Figure 6:
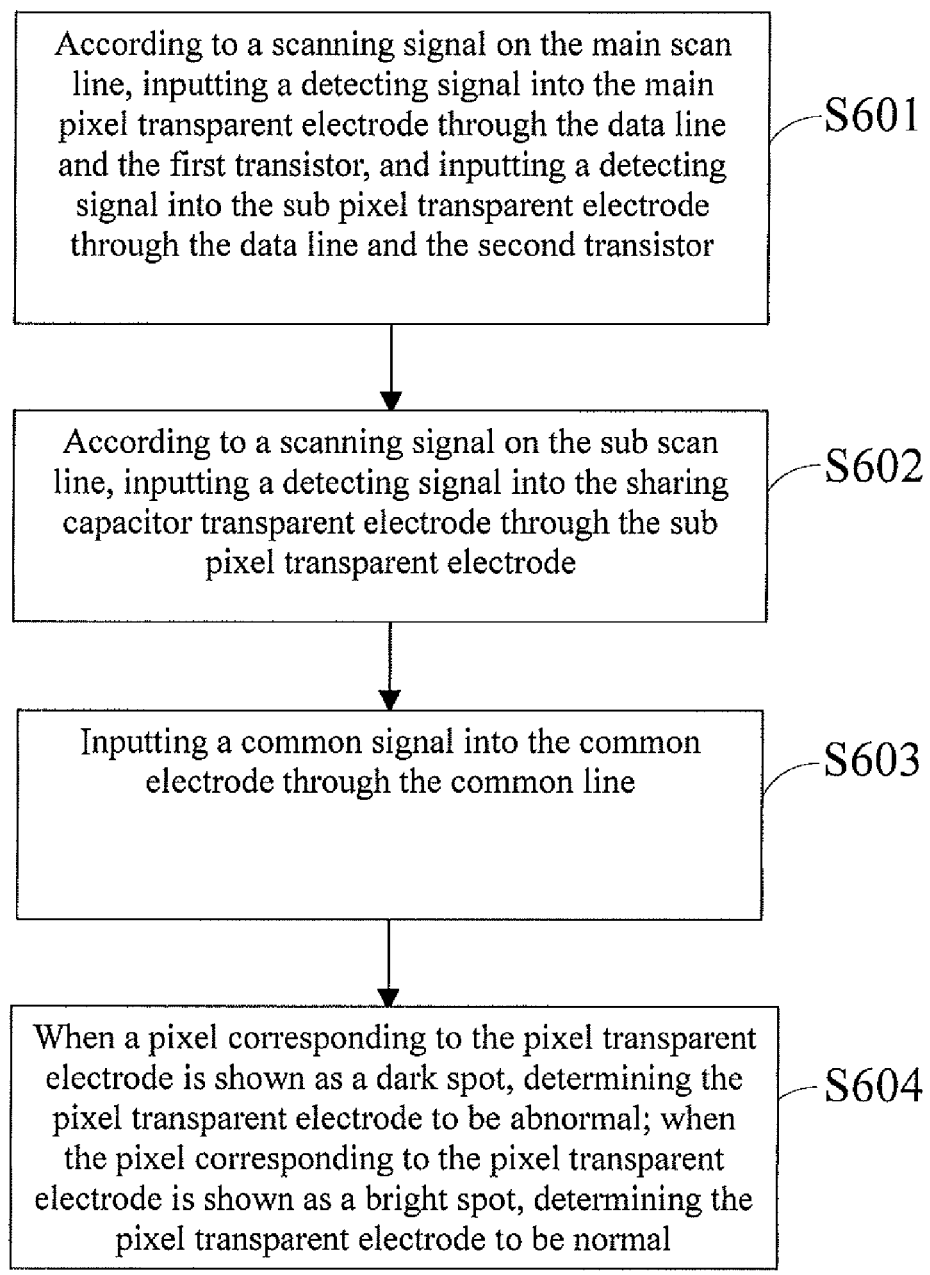
FIG. 6 is a flow chart of a detecting method of the liquid crystal display panel according to a preferred embodiment of the present invention.

The present invention further provides a detecting method of the liquid crystal display panel, which is used to detect the above-mentioned array substrate of the liquid crystal display panel. Please refer to FIG. 6, which is a flow chart of a detecting method of the liquid crystal display panel according to a preferred embodiment of the present invention. The detecting method of the liquid crystal display panel comprises:

Step S601: according to a scanning signal on the main scan line, inputting a detecting signal into the main pixel transparent electrode through the data line and the first transistor, and inputting a detecting signal into the sub pixel transparent electrode through the data line and the second transistor.

Step S602: according to a scanning signal on the sub scan line, inputting a detecting signal into the sharing capacitor transparent electrode through the sub pixel transparent electrode.

Step S603: inputting a common signal into the common electrode through the common line.

Step S604: when a pixel corresponding to the pixel transparent electrode is shown as a dark spot, determining the pixel transparent electrode to be abnormal; when the pixel corresponding to the pixel transparent electrode is shown as a bright spot, determining the pixel transparent electrode to be normal.

The specific procedures of the detecting method of the liquid crystal display panel according to a preferred embodiment is described in further detail below.

In the Step S601, a high level scanning signal is inputted into the main scan line, and the first transistor is conducted, so that the detecting signal on the data line is inputted into the main pixel transparent electrode through the first transistor. At the same time, the second transistor is also conducted under the control of the high level scanning signal of the main scan line, and the detecting signal on the data line is inputted into the sub pixel transparent electrode through the second transistor. Next is the Step S602.

In the Step S602, a high level scanning signal is inputted into the sub scan line, and the third transistor is conducted, so that the detecting signal on the sub pixel transparent electrode is inputted into the sharing capacitor transparent electrode through the third transistor. Next is the Step S603.

In the Step S603, a low level common signal is inputted into the common electrode by the common line. Next is the Step S604.

In the Step S604, according to the display condition of the pixel, if the pixel corresponding to the pixel transparent electrode is a dark spot, it means one of the following: the sharing capacitor transparent electrode is connected with the common electrode in the separating area; the pixel transparent electrode is connected with the common electrode in the separating area; or the sharing capacitor transparent electrode and the pixel transparent electrode are simultaneously connected with the common electrode in the separating area. Therefore, the electric potential of the pixel transparent electrode is lowered by the low electric potential of the common electrode, so that the pixel transparent electrode is abnormal.

If the pixel corresponding to the pixel transparent electrode is a bright spot, it means one of the following: the sharing capacitor transparent electrode is not connected with the common electrode; the pixel transparent electrode is also not connected with the common electrode. Therefore, the electric potential of the main pixel transparent electrode and sub pixel transparent electrode are not lowered by the low electric potential of the common electrode, so that the pixel transparent electrode is normal.

Hence, the detecting method of the liquid crystal display panel according to the preferred embodiment is accomplished.

In the detecting method of the liquid crystal display panel according to the present invention, the defectiveness due to the ITO remaining on the surface of the array substrate can easily detected during detecting the display condition of the pixel.

Therefore, in the array substrate, the liquid crystal display panel, and the detecting method of the liquid crystal display panel according to the present invention, by being provided with a common electrode which is exposed in the separating area, defectiveness of the products due to the ITO remaining on the surface of the array substrate can easily detected. It solves a technical problem that the ITO remaining on the surface of the array substrate cannot be detected in the conventional array substrate, liquid crystal display panel, and detecting method of the liquid crystal display panel.

The present invention has been described with preferred embodiments thereof and it is understood that many changes and modifications to the described embodiments can be carried out without departing from the scope and the spirit of the invention that is intended to be limited only by the appended claims.

The invention claimed is:

1. An array substrate, comprising:
a substrate;
at least one common electrode disposed on the substrate and being configured to provide a common signal;
an insulating layer disposed on the common electrode and being configured to separate the common electrode from at least one sharing capacitor transparent electrode;
at least one pixel transparent electrode disposed on the insulating layer and being configured to form a liquid crystal capacitor with another transparent electrode of a cell assembling substrate; and
the sharing capacitor transparent electrode disposed on the insulating layer and being configured to form an electric charge sharing capacitor with the common electrode;
wherein a separating area is disposed between the pixel transparent electrode and the sharing capacitor transparent electrode; the common electrode extends to the separating area, and is exposed on the surface of the separating area by at least one groove which is on the insulating layer; and
wherein if a pixel corresponding to the pixel transparent electrode is a dark spot, the sharing capacitor transparent electrode is connected with the common electrode in the separating area, and/or the pixel transparent electrode is connected with the common electrode in the separating area.

2. The array substrate according to claim 1, wherein a length of the at least one groove is approximately equal to the length of the separating area.

3. The array substrate according to claim 1, wherein the insulating layer is provided with a plurality of grooves which are used to expose the common electrode.

4. The array substrate according to claim 1, wherein the array substrate further comprises a data line, a main scan line, a sub scan line, a first transistor, a second transistor, and a third transistor; the pixel transparent electrode comprises a main pixel transparent electrode and a sub pixel transparent electrode.

5. The array substrate according to claim 4, wherein the data line is respectively connected with a source electrode of the first transistor and a source electrode of the second transistor; the main pixel transparent electrode is respectively connected with a drain electrode of the first transistor and a drain electrode of the second transistor; the sub pixel transparent electrode is respectively connected with the drain electrode of the first transistor and the drain electrode of the second transistor; the main scan line is respectively connected with a gate electrode of the first transistor and a gate electrode of the second transistor; the sub scan line is connected with a gate electrode of the third transistor; the source of the third transistor is connected with the sub pixel transparent electrode; and the drain of the third transistor is connected with the sharing capacitor transparent electrode.

6. A liquid crystal display panel, comprising an array substrate, a cell assembling substrate, and a liquid crystal layer disposed between the array substrate and the cell assembling substrate, wherein the array substrate comprises:
a substrate;
at least one common electrode disposed on the substrate and being configured to provide a common signal;
an insulating layer disposed on the common electrode and being configured to separate the common electrode from at least one sharing capacitor transparent electrode;
at least one pixel transparent electrode disposed on the insulating layer and being configured to form a liquid crystal capacitor with another transparent electrode of the cell assembling substrate; and
the sharing capacitor transparent electrode disposed on the insulating layer, which is used to form an electric charge sharing capacitor with the common electrode;
wherein a separating area is disposed between the pixel transparent electrode and the sharing capacitor transparent electrode; the common electrode extends to the separating area, and is exposed on the surface of the separating area by at least one groove which is on the insulating layer; and
wherein if a pixel corresponding to the pixel transparent electrode is a dark spot, the sharing capacitor transparent electrode is connected with the common electrode in the separating area, and/or the pixel transparent electrode is connected with the common electrode in the separating area.

7. The liquid crystal display panel according to claim 6, wherein a length of the at least one groove is approximately equal to the length of the separating area.

8. The liquid crystal display panel according to claim 6, wherein the insulating layer is provided with a plurality of grooves which are used to expose the common electrode.

9. The liquid crystal display panel according to claim 6, wherein the array substrate further comprises a data line, a main scan line, a sub scan line, a first transistor, a second transistor, and a third transistor; the pixel transparent electrode comprises a main pixel transparent electrode and a sub pixel transparent electrode.

10. The liquid crystal display panel according to claim 9, wherein the data line is respectively connected with a source electrode of the first transistor and a source electrode of the second transistor; the main pixel transparent electrode is respectively connected with a drain electrode of the first transistor and a drain electrode of the second transistor; the sub pixel transparent electrode is respectively connected with the drain electrode of the first transistor and the drain electrode of the second transistor; the main scan line is respectively connected with a gate electrode of the first transistor and a gate electrode of the second transistor; the sub scan line is connected with a gate electrode of the third transistor; the source of the third transistor is connected with the sub pixel transparent electrode; and the drain of the third transistor is connected with the sharing capacitor transparent electrode.

\* \* \* \* \*